United States Patent
Zhang et al.

(10) Patent No.: US 12,205,198 B2
(45) Date of Patent: Jan. 21, 2025

(54) METHOD AND SYSTEM FOR GENERATING MAGNETIC RESONANCE IMAGE, AND COMPUTER READABLE STORAGE MEDIUM

(71) Applicant: GE Precision Healthcare LLC, Wauwatosa, WI (US)

(72) Inventors: Ying Zhang, Shanghai (CN); Jingjing Xia, Shanghai (CN); Zhoushe Zhao, Bejing (CN)

(73) Assignee: GE Precision Healthcare LLC, Waukesha, WI (US)

( * ) Notice: Subject to any disclaimer, the term of this patent is extended or adjusted under 35 U.S.C. 154(b) by 555 days.

(21) Appl. No.: 17/546,955

(22) Filed: Dec. 9, 2021

(65) Prior Publication Data
US 2022/0180575 A1  Jun. 9, 2022

(51) Int. Cl.
*G06K 9/00* (2022.01)
*G01R 33/56* (2006.01)
*G06N 3/08* (2023.01)
*G06T 11/00* (2006.01)

(52) U.S. Cl.
CPC ........ *G06T 11/005* (2013.01); *G01R 33/5602* (2013.01); *G01R 33/5608* (2013.01); *G06N 3/08* (2013.01); *G06T 2207/10088* (2013.01); *G06T 2207/20081* (2013.01); *G06T 2207/20084* (2013.01)

(58) Field of Classification Search
CPC .... G06T 11/003; G06T 11/005; G06T 11/008; G06T 2207/10088; G06T 2207/20081; G06T 2207/20084; G01R 33/50; G01R 33/5602; G01R 33/5608; G06N 3/08
See application file for complete search history.

(56) References Cited

U.S. PATENT DOCUMENTS

| 2016/0133037 A1* | 5/2016 | Vemulapalli ...... G06F 18/21345 382/128 |
| 2020/0142017 A1* | 5/2020 | Taniguchi ............. G06T 7/0012 |

OTHER PUBLICATIONS

Chen et al., "Automatic PET Cervical Tumor Segmentation by Combining Deep Learning and Anatomic Prior," Phys Med Biol. Apr. 12, 2019; 64(8): 085019, doi: 10.1088/1361-6560/ab0b64, 33 pages.
Roychowdhury et al., "Image classification using deep learning and prior knowledge." Workshops at the Thirty-Second AAAI Conference on Artificial Intelligence. 2018. 7 pages.
Ulyanov et al., "Deep Image Prior", Proceedings of the IEEE Conference on Computer Vision and Pattern Recognition (CVPR), 2018, pp. 9446-9454, 9 pages.
Xiang et al., "Deep Embedding Convolutional Neural Network for Synthesizing CT Image from T1-Weighted MR Image," arXiv:1709.02073v2, Medical Image Analysis, Sep. 7, 2017, 26 pages.

\* cited by examiner

*Primary Examiner* — Duy M Dang
(74) *Attorney, Agent, or Firm* — Fletcher Yoder, P.C.

(57) ABSTRACT

Provided in embodiments of the present invention are a method and a system for generating a magnetic resonance image and a computer-readable storage medium. The method comprises: acquiring a plurality of quantitative maps; synthesizing a first weighted image on the basis of the plurality of quantitative maps; and converting the first weighted image into a corresponding second weighted image on the basis of a trained deep learning network.

11 Claims, 6 Drawing Sheets

METHOD AND SYSTEM FOR GENERATING MAGNETIC RESONANCE IMAGE, AND COMPUTER READABLE STORAGE MEDIUM

CROSS-REFERENCE TO RELATED APPLICATIONS

This application claims priority pursuant to 35 U.S.C. 119(a) to China Patent Application No. 202011428615.6, filed Dec. 9, 2020, which application is incorporated herein by reference in its entirety.

TECHNICAL FIELD

Embodiments disclosed in the present invention relate to medical imaging technologies, and more particularly relate to a method and a system for generating a magnetic resonance image, and a computer-readable storage medium.

BACKGROUND

Magnetic resonance imaging (MRI), as a medical imaging modality, can obtain three-dimensional images of the human body without using X-rays or other ionizing radiation.

MRI uses a magnet having a strong magnetic field to generate a static magnetic field B0. When a body part to be imaged is positioned in the static magnetic field B0, nuclear spin associated with hydrogen nuclei in human tissues is polarized. The tissue of the body part thus generates a longitudinal magnetization vector at a macroscopic level, which is in a balanced state. After a radio-frequency field B1 intersecting the direction of the static magnetic field B0 is applied, the direction of rotation of protons changes, the longitudinal magnetization vector decays, and the tissue of the body part generates a transverse magnetization vector at a macroscopic level.

After the radio-frequency field B1 is removed, the longitudinal magnetization strength is gradually restored to the balanced state, the transverse magnetization vector decays in a spiral manner until the vector is restored to zero. A magnetic resonance signal is generated during the restoration of the longitudinal magnetization vector and the decay of the transverse magnetization vector. The magnetic resonance signal can be acquired, and a tissue image of the part to be imaged can be reconstructed on the basis of the acquired signal.

The length of time for the longitudinal magnetization vector to restore to the balanced state is usually referred to as longitudinal relaxation time, namely, T1. The length of time for the decay of the transverse magnetization vector to zero is referred to as transverse relaxation time, namely, T2. Different tissues of the human body usually have different T1 and different T2. Additionally, different tissues of the human body usually have different proton densities (PDs).

During an MRI scan, scan parameters (or scan sequences) can be adjusted to obtain an image that highlights T1 contrasts between tissues (T1-weighted image, T1WI), an image that highlights T2 contrasts between tissues (T2-weighted image, T2WI), and an image that highlights proton density contrasts between tissues (PD-weighted image, such as Flair).

In order to meet the needs of clinical diagnosis, it is often necessary to execute a plurality of scan sequences for the same imaging part (such as the brain) to separately obtain the aforementioned different types of weighted images. This makes MRI examinations usually take a long time.

SUMMARY

An aspect of the present invention provides a method for generating a magnetic resonance image, comprising: acquiring a plurality of quantitative maps; synthesizing a first weighted image on the basis of the plurality of quantitative maps; and converting the first weighted image into a corresponding second weighted image on the basis of a trained deep learning network.

In another aspect, the acquiring a plurality of quantitative maps comprises: calculating the plurality of quantitative maps on the basis of an initial image, the initial image being generated by executing a preset scan sequence by means of a magnetic resonance imaging device.

In another aspect, the plurality of quantitative maps comprise a T1 quantitative map, a T2 quantitative map, and a proton density quantitative map.

In another aspect, the step of synthesizing a first weighted image comprises: determining the first weighted image according to a preset relationship between a quantitative value in the plurality of quantitative maps and a hypothetical sequence parameter and an image signal value.

In another aspect, the hypothetical sequence parameter comprises part or all of hypothetical echo time, hypothetical repetition time, and hypothetical inversion recovery time.

In another aspect, the first weighted image is a T1-weighted image, a T2-weighted image, or a proton density-weighted image, and the first weighted image is obtained on the basis of the following formula:

$$S=PD\cdot\exp(-TE/T2)\cdot(1-\exp(-TR/T2)),$$

where S is an image signal value of the first weighted image, exp is an exponential function with the natural constant e as a base, TE is the hypothetical echo time, TR is the hypothetical repetition time, and T1, T2, and PD are a T1 quantitative value, a T2 quantitative value, and a proton density quantitative value, respectively.

In another aspect, the first weighted image is a T1WI-Flair image, a T2WI-Flair image, a STIR image, or a PSIR image, and the first weighted image is obtained on the basis of the following formula:

$$S=PD\cdot\exp(-TE/T2)\cdot(1-2\cdot\exp(-TI/T1)+\exp-TR/T1),$$

where S is an image signal value of the first weighted image, exp is an exponential function with the natural constant e as a base, TE is the hypothetical echo time, TR is the hypothetical repetition time, TI is the hypothetical inversion recovery time, and T1, T2, and PD are a T1 quantitative value, a T2 quantitative value, and a proton density quantitative value, respectively.

In another aspect, the step of synthesizing a first weighted image further comprises: separately performing a convolution operation on the plurality of quantitative maps, and synthesizing the first weighted image on the basis of a result of the convolution operation.

In another aspect, an input data set for training the deep learning network comprises a plurality of the first weighted images, and an output data set for training the deep learning network comprises: a plurality of real weighted images obtained by performing a magnetic resonance imaging scan and performing image reconstruction on the basis of scan data.

In another aspect, a network parameter of the deep learning network is obtained by solving the following formula: $\min_\theta \|f(\theta)-f\|2$, where $\theta$ is the network parameter, f comprises the real weighted image, $f(\theta)$ represents an output of the deep learning network, and min represents minimization.

Another aspect of the present invention further provides a computer-readable storage medium, comprising a stored computer program, wherein the method according to any one of the aforementioned aspects is performed when the computer program is run.

Another aspect of the present invention further provides a system for generating a magnetic resonance image, comprising: a quantitative map acquisition module, configured to acquire a plurality of quantitative maps; an image synthesis module, configured to synthesize a first weighted image on the basis of the plurality of quantitative maps; and a conversion module, configured to convert the first weighted image into a corresponding second weighted image on the basis of a trained deep learning network.

In another aspect, the system further comprises: a magnetic resonance imaging device, configured to generate an initial image; and a calculation module, configured to calculate the plurality of quantitative maps on the basis of the initial image.

It should be understood that the brief description above is provided to introduce in simplified form some concepts that will be further described in the Detailed Description of the Embodiments. The brief description above is not meant to identify key or essential features of the claimed subject matter. The scope is defined uniquely by the claims that follow the detailed description. Furthermore, the claimed subject matter is not limited to implementations that solve any disadvantages noted above or in any section of the present disclosure.

BRIEF DESCRIPTION OF THE DRAWINGS

The present invention will be better understood by reading the following description of non-limiting embodiments with reference to the accompanying drawings, where.

DETAILED DESCRIPTION

Various embodiments described below include a method and a system for generating a magnetic resonance image, and a computer-readable storage medium.

Figure 1:
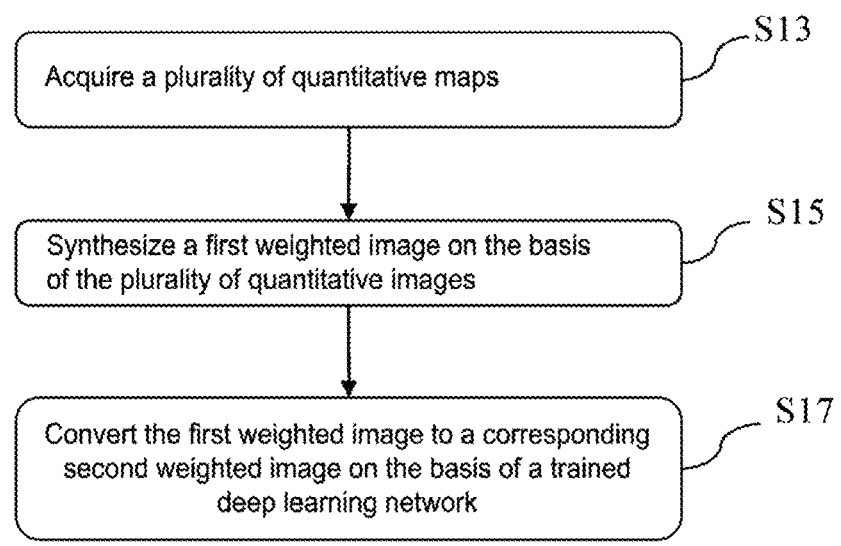
FIG. 1 shows a flowchart of a method for generating a magnetic resonance image according to an embodiment of the present invention.
Figure 2:
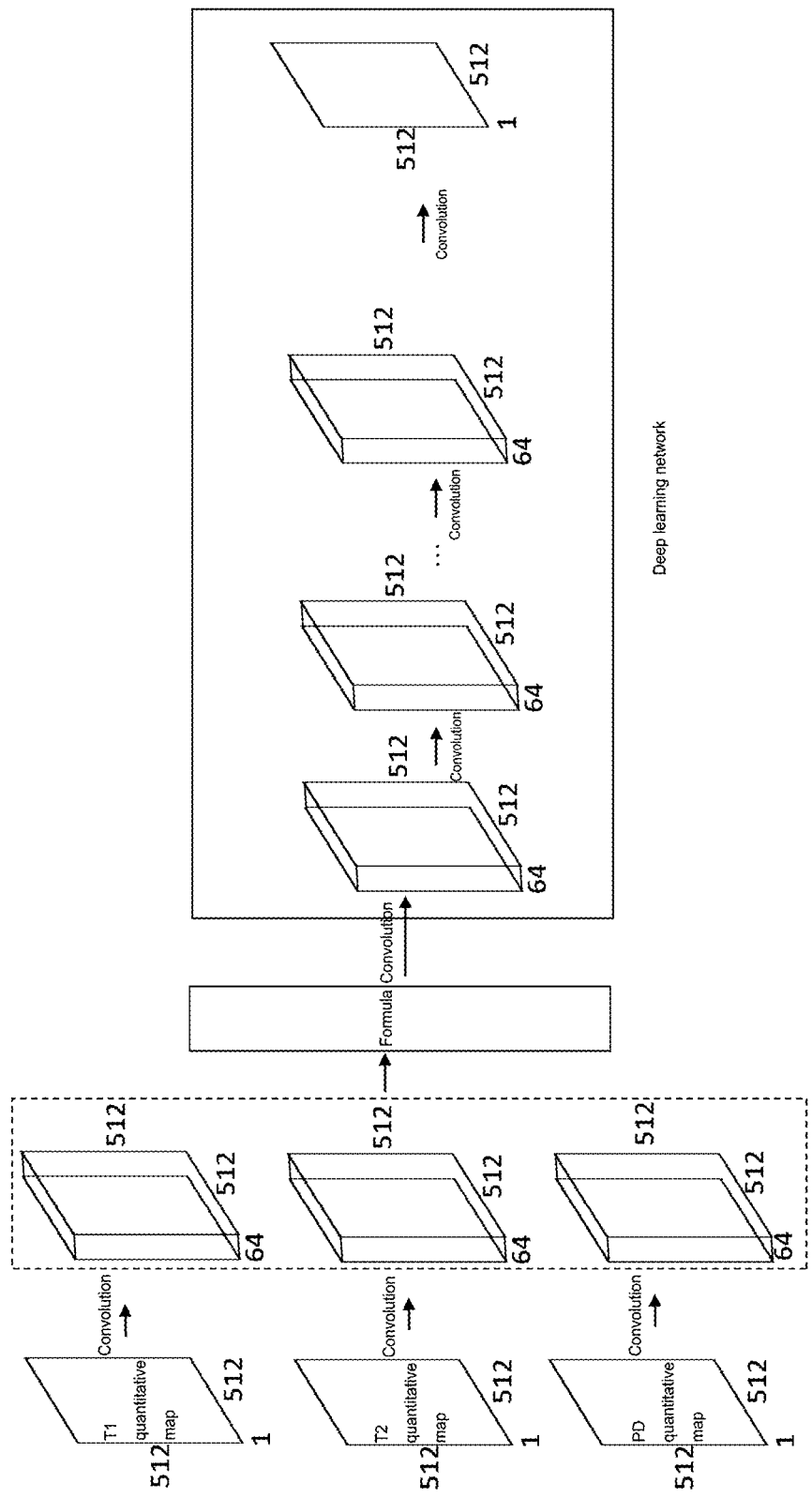
FIG. 2 is an example diagram of generating a magnetic resonance image using the method shown in FIG. 1.

FIG. 1 shows a flowchart of an embodiment of the method, and FIG. 2 shows an example diagram of generating a magnetic resonance image using the method. Referring to FIG. 1 and FIG. 2, in step S13, a plurality of quantitative maps are acquired. Specifically, step S13 may include a step of calculating the quantitative maps on the basis of an initial image. The initial image is generated by executing a scan sequence by a magnetic resonance imaging device, and may be a model image or a real image. Techniques for executing the scan sequence by the magnetic resonance imaging device and reconstructing the magnetic resonance image will be described below in conjunction with FIG. 3.

For example, a characteristic parameter (or quantitative value) of a corresponding voxel may be calculated by using a signal value of each pixel in the initial image data, and the distribution of the characteristic parameter on the image forms a quantitative map thereof. In an embodiment, the quantitative value or characteristic parameter may include T1, T2, and proton density.

There are various scan sequences that are executed when the initial image is generated in order to obtain the quantitative map, for example, the scan sequence may be a spin echo (SE) sequence, a fast spin echo (FSE) sequence, a gradient echo (GE) sequence, an inversion recovery (IR) sequence, a turbo field echo (TFE) sequence, or a combination of two or more selected from the above sequences. Using an equation relationship between the signal value in the initial image pixel obtained and the sequence parameter, quantitative values such as T1, T2, and proton density can be solved.

Known techniques may be used to calculate T1, T2, and proton density on the basis of the magnetic resonance image to obtain a corresponding T1 quantitative map, T2 quantitative map, and proton density quantitative map, which will not be repeated herein.

In other embodiments, a known quantitative map may be stored in a storage space so as to be able to be recalled for implementing the embodiments of the present invention.

Still referring to FIG. 1 and FIG. 2, in step S15, a first weighted image is synthesized on the basis of the plurality of quantitative maps.

In an embodiment of the present invention, the first weighted image may be determined according to a preset relationship between a quantitative value at a corresponding position in the plurality of quantitative images and a hypothetical sequence parameter and a weighted image signal value, and the first weighted image may include any one of a T1-weighted image (T1WO, a T2-weighted image (T2WI), a proton density-weighted image (PDWI), a T1W-Flair image, a T2W-Flair image, a STIR image, a PSIR image, and a PSIR-vossel image. The preset relationship may be described by using an image synthesis formula. The hypothetical sequence parameter may include part or all of hypothetical echo time (TE), hypothetical repetition time (TR), and hypothetical inversion recovery time (TI).

Since an actual scan sequence is not executed in the process of generating the weighted image of each quantitative (or characteristic parameter) by using the quantitative map, the weighted images of these quantitative parameters are generated according to preset relationships between sequence parameters of hypothetical scan sequences and these quantitative values, and changing the hypothetical values of these sequence parameters can obtain images that highlight different quantitative contrasts.

In a specific embodiment, in step S15, the first weighted image is synthesized on the basis of the following formula (1).

$$S=PD\cdot\exp(-TE/T2)\cdot(1-\exp(-TR/T2)), \quad (1)$$

where S is a signal value of the first weighted image, and calculating the S value for each pixel on the basis of the above formula may obtain, for example, a T1WI image or a T2WI image, exp is an exponential function with the natural constant e as a base, TE is the hypothetical echo time, TR is the hypothetical repetition time, and T1, T2, and PD are a T1 quantitative value, a T2 quantitative value, and a proton density quantitative value, respectively.

When a smaller TE value (for example, 10 milliseconds) and a smaller TR value (for example, 500 milliseconds) are set for formula (1), the resulting image is a T1WI. The image may have image characteristics similar to those of an image reconstructed by executing a T1-weighted scan sequence, for example, a water-containing tissue region such as a cerebrospinal fluid is a dark region.

When a larger TE value (for example, 100 milliseconds) and a larger TR value (for example, 4500 milliseconds) are set for formula (1), the resulting image is a T2WI. The image may have image characteristics similar to those of an image reconstructed by executing a T2-weighted scan sequence, for example, a water-containing tissue region such as a cerebrospinal fluid is a highlighted region.

When a smaller TE value (for example, 10 milliseconds) and a larger TR value (for example, 8000 milliseconds) are set for formula (1), the resulting image is a PDWI. The image may have image characteristics similar to those of an image reconstructed by executing a proton density-weighted scan sequence, for example, the higher the hydrogen proton content of a tissue, the stronger an image signal thereof.

In the prior art, there are a variety of scan sequences for T1 weighting, T2 weighting, and proton density weighting, which will not be repeated herein.

In step S15, the first weighted image may also be synthesized on the basis of the following formula (2). Specifically, a T1W-Flair (FLuid Attenuated Inversion Recovery) image, a T2W-Flair image, a STIR (Short T1 Inversion Recovery) image, a PSIR (Phase Sensitive Inversion Recovery) image, or a PSIR vossel image, etc. may be synthesized.

$$S=PD\cdot\exp(-TE/T2)\cdot(1-2\cdot\exp(-TI/T1)+\exp(-TR/T1)) \quad (2)$$

where S is the signal value of the first weighted image, exp is an exponential function with the natural constant e as a abase, TE is the hypothetical echo time, TR is the hypothetical repetition time, and TI is the hypothetical inversion recovery time.

When a smaller TE value (for example, 10 milliseconds) and a smaller TR value (for example, 2500 milliseconds) are set for formula (2) and an appropriate TI value (for example, 1050 milliseconds) is set, the resulting image is a T1W-Flair image. The image may have image characteristics similar to those of an image reconstructed by executing a T1W-Flair scan sequence.

When a larger TE value (for example, 100 milliseconds) and a larger TR value (for example, 15000 milliseconds) are set for formula (2) and an appropriate TI value (for example, 3000 milliseconds) is set, the resulting image is a T2W-Flair image. The image may have image characteristics similar to those of an image reconstructed by executing a T2W-Flair scan sequence.

When a larger TE value (for example, 100 milliseconds) and a larger TR value (for example, 15000 milliseconds) are set for formula (2) and a smaller TI value (for example, 300 milliseconds) is set, the resulting image S is a STIR image. The image may have similar image characteristics, such as fat suppression characteristics, as an image reconstructed by executing a STIR scan sequence.

When a smaller TE value (for example, 10 milliseconds) and a larger TR value (for example, 6000 milliseconds) are set for formula (2) and a smaller TI value (for example, 500 milliseconds) is set, the resulting image is a PSIR image. The image may have image characteristics similar to those of an image reconstructed by executing a PSIR scan sequence.

When a smaller TE value (for example, 10 milliseconds) and a larger TR value (for example, 8000 milliseconds) are set for formula (2) and a smaller TI value (for example, 10 milliseconds) is set, the resulting image is a PSIR vossel image. The image may have image characteristics similar to those of an image reconstructed by executing a PSIR vossel scan sequence.

There are also a variety of T1W-Flair, T2W-Flair, STIR, PSIR, and PSIR vossel scan sequences in the prior art, which will not be repeated herein.

In another aspect, in order to perform proper feature extraction, before the T1, T2, and PD quantitative maps obtained in step S13 are inputted into the image synthesis formula, a convolution operation is further performed thereon, and in step S15, the T1, T2, and PD quantitative maps obtained after the convolution operation are inputted into the corresponding image synthesis formula to synthesize the first weighted image.

For example, if the sizes of the obtained T1, T2, and PD quantitative maps are each 512*512, the input of the convolution operation may be 512*512*1 (where 1 is the number of input channels or the image thickness or the number of layers), and after a convolution operation is performed using convolution kernels with a size of 5*5*1*64 (where 5, 5, and 1 are the length, width, and thickness of the convolution kernels respectively, and 64 is the number of convolution kernels), a characteristic image obtained is 512*512*64 (where 512, 512, and 64 are the length, width, and thickness of the output image, respectively), and is inputted into formula (1) or (2) or other appropriate formulas, and after the value of the sequence parameter in the formula is set, the corresponding first weighted image can be outputted.

As described above, an initial image may be obtained through a single short-time magnetic resonance scanning procedure, and on the basis of the initial image, a quantitative value related to each pixel may be calculated. In step S15, by setting a hypothetical sequence parameter value on the basis of a preset relationship between the quantitative value and a specific weighted image and the sequence parameter, the first weighted image can be generated. As described above, the generated first weighted image may have image characteristics similar to those of a reconstructed image obtained after executing a specific scan sequence. However, due to the complexity of magic resonance imaging, an actual magic resonance imaging result may be affected by other factors than the aforementioned sequence parameters; therefore, the first weighted image may still be quite different from an actual scanned image, making it difficult to directly use the first weighted image for clinical observation.

Therefore, as shown in FIG. 1 and FIG. 2, the method in this embodiment further includes step S17: converting each first weighted image into a corresponding second weighted image on the basis of a trained deep learning network.

An input data set for training the deep learning network may include a plurality of first weighted images obtained according to step S15, and an output data set for training the deep learning network may include real weighted images obtained by performing a magnetic resonance imaging scan and performing image reconstruction on the basis of scan data, for example, real T1-weighted images, real T2-weighted images, real proton density-weighted images, real T1W-Flair images, real T2W-Flair images, real STIR images, real PSIR images, etc.

Specifically, the deep learning network may be obtained by training on the basis of an ADAM (Adaptive Moment Estimation) optimization method or other well-known models. After the deep learning network is created or trained, a first weighted image that is more similar to an actual scanned image can be obtained simply by inputting each of the aforementioned first weighted images into the network.

The aforementioned deep learning network may include an input layer, an output layer, and a processing layer (or referred to as a hidden layer). The input layer is used to preprocess inputted data or image, for example, de-averaging, normalization, or dimensionality reduction, etc. The processing layer may include a plurality of convolutional layers for feature extraction and an excitation layer for performing a nonlinear mapping on the output result of the convolutional layer.

Each convolutional layer includes several neurons, and the numbers of neurons in the plurality of convolutional layers may be the same or may be set differently as required. On the basis of the first weighted image (known input) and the real weighted image (expected output), the number of processing layers in the network and the number of neurons in each processing layer are set, and a weight and/or a bias of the network is estimated (or adjusted or calibrated), so as to identify a mathematical relationship between the known input and the expected output and/or identify a mathematical relationship between the input and output of each layer.

Specifically, when the number of neurons in one of the layers is n, and values corresponding to the n neurons are $X_1, X_2, \ldots,$ and $X_n$, the number of neurons in a next layer connected to the layer is m, and values corresponding to the m neurons are $Y_1, Y_2, \ldots,$ and $Y_m$, then the two adjacent layers may be represented as:

$$Y_j = f(\Sigma_{i=1}^{n} W_{ji} X_i + B_j)$$

where $X_i$ represents a value corresponding to the $i^{th}$ neuron of the previous layer, Y represents a value corresponding to the $j^{th}$ neuron of the next layer, $W_{ji}$ represents a weight, and $B_j$ represents a bias. In some embodiments, the function f is a rectified linear function.

Therefore, by adjusting the weight $W_{ji}$ and/or the bias $B_j$, the mathematical relationship between the input and output of each layer can be identified, so that a loss function converges, so as to obtain the aforementioned deep learning network by training In this embodiment, network parameters of the deep learning network are obtained by solving the following formula (3):

$$\min \theta \| f(\theta) - f \|_2 \quad (3)$$

where θ represents a network parameter of the deep learning network, which may include the aforementioned weight $W_{ji}$ and/or bias $B_j$, f includes a real weighted image, for example, any one of the aforementioned real weighted images, f(θ) represents an output of the deep learning network, and min represents minimization. The network parameters are set by minimizing the difference between a network output image and an actual scanned image to construct the deep learning network.

In one embodiment, although the configuration of the deep learning network is guided by dimensions such as prior knowledge, input, and output of an estimation problem, optimal approximation of required output data is implemented depending on or exclusively according to input data. In various alternative implementations, clear meaning may be assigned to some data representations in the deep learning network using some aspects and/or features of data, an imaging geometry, a reconstruction algorithm, or the like, which helps to speed up training. This creates an opportunity to separately train (or pre-train) or define some layers in the deep learning network.

In some embodiments, the aforementioned trained network is obtained based on training by a training module on an external carrier (for example, an apparatus outside the medical imaging system). In some embodiments, the training system may include a first module configured to store a training data set, a second module configured to perform training and/or update based on a model, and a communication network configured to connect the first module and the second module. In some embodiments, the first module includes a first processing unit and a first storage unit, where the first storage unit is configured to store the training data set, and the first processing unit is configured to receive a relevant instruction (for example, acquiring a training data set) and send the training data set according to the instruction. In addition, the second module includes a second processing unit and a second storage unit, where the second storage unit is configured to store a training model, and the second processing unit is configured to receive a relevant instruction and perform training and/or update of the network. In some other embodiments, the training data set may further be stored in the second storage unit of the second module, and the training system may not include the first module. In some embodiments, the communication network may include various connection types, such as wired or wireless communication links, or fiber-optic cables.

Once data (for example, a trained network) is generated and/or configured, the data can be replicated and/or loaded into the medical imaging system (for example, the magnetic resonance imaging system that will be described below), which may be accomplished in a different manner. For example, a model may be loaded via a directional connection or link between the medical imaging system and a computer. In this regard, communication between different elements may be accomplished using an available wired and/or wireless connection and/or based on any suitable communication (and/or network) standard or protocol. Alternatively or additionally, the data may be indirectly loaded into the medical imaging system. For example, the data may be stored in a suitable machine-readable medium (for example, a flash memory card), and then the medium is used to load the data into the medical imaging system (for example, by a user or an authorized person of the system on site); or the data may be downloaded to an electronic device (for example, a laptop computer) capable of local communication, and then the device is used on site (for example, by a user or an authorized person of the system) to upload the data to the medical imaging system via a direct connection (for example, a USB connector).

As discussed herein, the deep learning technology (also referred to as deep machine learning, hierarchical learning, deep structured learning, or the like) employs an artificial neural network for learning. The deep learning method is characterized by using one or a plurality of network architectures to extract or simulate data of interest. The deep learning method may be implemented using one or a plurality of processing layers (for example, an input layer, an output layer, a convolutional layer, a normalization layer, or a sampling layer, where processing layers of different numbers and functions may exist according to different deep network models), where the configuration and number of the layers allow a deep network to process complex information extraction and modeling tasks. Specific parameters (or referred to as "weight" or "bias") of the network are usually estimated through a so-called learning process (or training process). The learned or trained parameters usually result in (or output) a network corresponding to layers of different levels, so that extraction or simulation of different aspects of initial data or the output of a previous layer usually may represent the hierarchical structure or concatenation of layers. During image processing or reconstruction, this may be represented as different layers with respect to different feature levels in the data. Thus, processing may be performed layer by layer. That is, "simple" features may be extracted from input data for an earlier or higher-level layer, and then these simple features are combined into a layer exhibiting features of higher complexity. In practice, each layer (or more specifically, each "neuron" in each layer) may process input data as output data for representation using one or a plurality of linear and/or non-linear transformations (so-called activation functions). The number of the plurality of "neurons" may be constant among the plurality of layers or may vary from layer to layer.

As discussed herein, as part of initial training of a deep learning process for solving a specific problem, a training data set includes a known input value and an expected (target) output value finally outputted from the deep learning process. In this manner, a deep learning algorithm can process the training data set (in a supervised or guided manner or an unsupervised or unguided manner) until a mathematical relationship between a known input and an expected output is identified and/or a mathematical relationship between the input and output of each layer is identified and represented. In the learning process, (part of) input data is usually used, and a network output is created for the input data. Afterwards, the created network output is compared with the expected output of the data set, and then a difference between the created and expected outputs is used to iteratively update network parameters (weight and/or bias). A stochastic gradient descent (SGD) method may usually be used to update network parameters. However, those skilled in the art should understand that other methods known in the art may also be used to update network parameters. Similarly, a separate validation data set may be used to validate a trained network, where both a known input and an expected output are known. The known input is provided to the trained network so that a network output can be obtained, and then the network output is compared with the (known) expected output to validate prior training and/or prevent excessive training.

Still referring to FIG. 1 and FIG. 2, in one example, when the first T1-weighted image with a size of 512*512*64 is obtained using formula (1), the first T1-weighted image is inputted into the above trained deep learning network, and a plurality of convolution operations are performed using convolution kernels with a size of 3*3*64*64, and then a convolution operation is performed using a convolution kernel with a size of 3*3*64*1, to obtain a second T1-weighted image with a size of 512*512*1.

Similarly, when a first Flair image with a size of 512*512*64 is obtained using formula (2), the first Flair image is inputted into the above trained deep learning network, and a plurality of convolution operations are performed using convolution kernels with a size of 3*3*64*64, and then a convolution operation is performed using a convolution kernel with a size of 3*3*64*1, to obtain a second Flair weighted image with a size of 512*512*1.

The aforementioned second T1-weighted image and second Flair image have optimized image quality, for example, the images can be directly used for clinical observation because the images are closer to actual scanned images.

Figure 3:
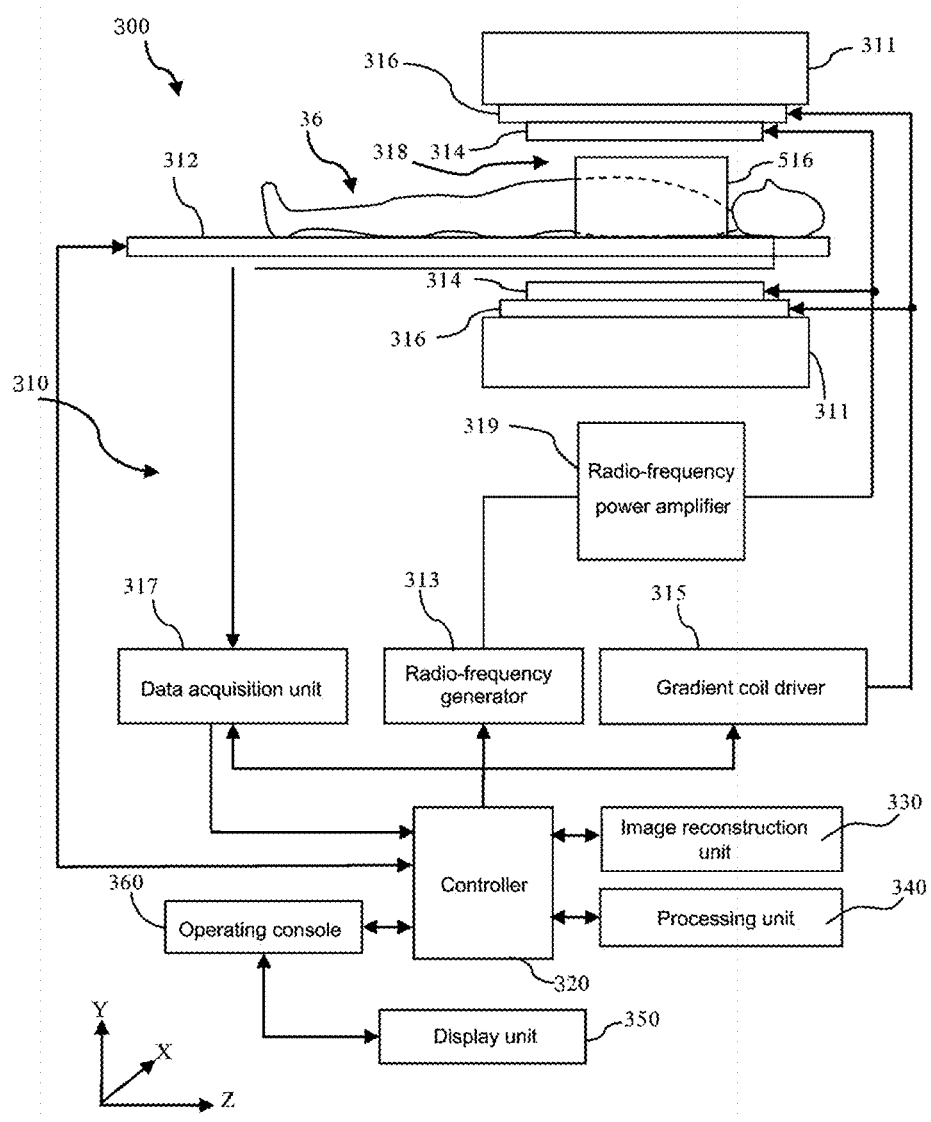
FIG. 3 shows a schematic structural diagram of a magnetic resonance imaging device.

FIG. 3 shows a schematic structural diagram of a magnetic resonance imaging device. As an example, the system can be used to execute a scan sequence to generate the aforementioned initial image, and can also be used to execute a scan sequence to generate a real weighted image, and can also be used to store or transfer the generated image to other systems.

The magnetic resonance imaging device 300 includes a scanner 310. The scanner 310 is configured to perform a magnetic resonance scan on an object (for example, a human body) 36 to produce image data of a region of interest of the object 36, and the region of interest may be a predetermined imaging part or imaging tissue.

The magnetic resonance imaging device 300 may further include a controller 320 coupled to the scanner 310 so as to control the scanner 310 to perform the aforementioned magnetic resonance scan procedure. Specifically, the controller 320 may send a sequence control signal to relevant components (such as a radio-frequency generator and a gradient coil driver that will be described below) of the scanner 310 by means of a sequence generator (not shown in the figure), so that the scanner 310 executes a preset scan sequence.

Those skilled in the art could understand that the "scan sequence" refers to a combination of pulses having specific amplitudes, widths, directions, and time sequences and applied when a magnetic resonance imaging scan is performed. The pulses may typically include, for example, a radio-frequency pulse and a gradient pulse. The radio-frequency pulses may include, for example, a radio-frequency transmit pulse for exciting protons in the body to resonate. The gradient pulses may include, for example, a slice selection gradient pulse, a phase encoding gradient pulse, a frequency encoding gradient pulse, etc. Generally, a plurality of scan sequences may be preset in the magnetic resonance system, so that a sequence corresponding to clinical test requirements can be selected. The clinical test requirements may include, for example, a part to be imaged, an imaging function, etc.

In an example, the scanner 310 may include a main magnet assembly 111, a table 312, a radio-frequency generator 313, a radio-frequency transmitting coil 314, a gradient coil driver 35, a gradient coil assembly 316, a radio-frequency power amplifier 319, and a data acquisition unit 317.

The main magnet assembly 311 usually includes an annular superconducting magnet defined in a housing. The annular superconducting magnet is mounted in an annular vacuum container. The annular superconducting magnet and the housing thereof define a cylindrical space surrounding the object 36, such as a scanning chamber 318 shown in FIG. 3. The main magnet assembly 311 generates a constant magnetic field, i.e., a B0 field, in a Z direction of the scanning chamber 318. Typically, a uniform portion of the B0 field is formed in a central region of the main magnet.

The table 312 is configured to carry the object 36, and travel in the Z direction to enter or exit the aforementioned scanning chamber 318 in response to the control of the controller 320. For example, in one embodiment, an imaging volume of the object 36 may be positioned in a central region of the scanning chamber with uniform magnetic field strength so as to facilitate scanning imaging of the imaging volume of the object 36.

The magnetic resonance imaging device 300 uses the formed B0 field to transmit a static magnetic pulse signal to the object 36 located in the scanning chamber, so that protons in a resonant volume in the body of the object 36 precess in an ordered manner to generate a longitudinal magnetization vector.

The radio-frequency generator 313 and the radio-frequency power amplifier 319 may serve as part of a radio-frequency transmit chain. The radio-frequency generator 313 is used to generate a radio-frequency pulse in response to a control signal of the controller 320. The radio-frequency pulse is usually a small radio-frequency signal having low power. The small radio-frequency signal may be amplified by the radio-frequency power amplifier 319, and then applied to the radio-frequency transmitting coil 314.

The radio-frequency transmitting coil 314 may be connected to a transmit/receive (T/R) switch. By controlling the transmit/receive switch, the body coil can be switched between a transmit mode and a receive mode. In the transmit mode, the radio-frequency transmitting coil 314 is used to transmit, in response to the aforementioned radio-frequency excitation pulse, to the object 16 a radio-frequency field B1 orthogonal to the static magnetic field B0, so as to excite nuclei in the body of the object 36, so as to transform the longitudinal magnetization vector into a transverse magnetization vector. In the receive mode, the body coil may be used to receive a magnetic resonance signal from the object 36.

After the end of the radio-frequency excitation pulse, a free induction decay signal is generated in the process in which the transverse magnetization vector of the object 36 is gradually restored to zero.

The gradient coil driver 315 is configured to provide a suitable current/power to the gradient coil assembly 316 in response to a gradient pulse control signal or a shimming control signal sent from the controller 320.

The gradient coil assembly 316, on one hand, forms a varying magnetic field in an imaging space so as to provide three-dimensional position information for the aforementioned magnetic resonance signal, and on the other hand generates a compensating magnetic field of the B0 field to shim the B0 field.

The gradient coil assembly 316 may include three gradient coils, which are respectively configured to generate magnetic field gradients inclined to three spatial axes (for example, the X-axis, Y-axis, and Z-axis) perpendicular to each other. More specifically, the gradient coil assembly 316 applies a magnetic field gradient in a slice selection direction (such as the Z direction) so as to select a layer in the imaging volume. Those skilled in the art will understand that the layer is any one of a plurality of two-dimensional slices distributed in the Z direction in the three-dimensional imaging volume. The aforementioned "Z-direction" is generally a direction extending from the head to the feet when a patient is positioned on the table 312. When a scan is performed on the object, the radio-frequency transmitting coil 314 transmits a radio-frequency excitation pulse to the layer of the imaging volume and excites the layer. The gradient coil assembly 316 applies a magnetic field gradient in a phase encoding direction (such as the Y direction) so as to perform phase encoding on a magnetic resonance signal of the excited layer. The gradient coil assembly 316 applies a gradient field in a frequency encoding direction (such as the X direction) of the object 36 so as to perform frequency encoding on the magnetic resonance signal of the excited layer.

The data acquisition unit 317 is configured to acquire the magnetic resonance signal (for example, received by the body coil or a surface coil) in response to a data acquisition control signal of the controller 320. In one embodiment, the data acquisition unit 317 may include, for example, a radio-frequency preamplifier, a phase detector, and an analog/digital converter, where the radio-frequency preamplifier is configured to amplify the magnetic resonance signal, the phase detector is configured to perform phase detection on the amplified magnetic resonance signal, and the analog/digital converter is configured to convert the phase-detected magnetic resonance signal from an analog signal to a digital signal.

The magnetic resonance imaging device 300 includes an image reconstruction unit 330, which can perform reconstruction on a series of two-dimensional slice images, namely, the aforementioned image sequence, of the imaging volume of the object 36 on the basis of the aforementioned digitized magnetic resonance signal. Specifically, the reconstruction unit may perform the aforementioned image reconstruction on the basis of communication with the controller 320.

The magnetic resonance imaging device 300 includes a processing unit 340, which can perform any required image processing on any image in the aforementioned image sequence, such as correcting an image and determining a display parameter of an image. The image processing described above may be an improvement or adaptive adjustment made to an image in any of contrast, uniformity, sharpness, brightness, etc. Specifically, the processing unit 340 may perform the aforementioned image processing on the basis of communication with the controller 120.

The magnetic resonance imaging device 300 may include a display unit 350, which may be configured to display an operation interface and various data or images generated in the data processing process.

The magnetic resonance imaging device 300 further includes a console 360, which may include user input devices, such as a keyboard, a mouse, etc. The controller 320 may communicate with the scanner 310, the image reconstruction unit, the processing unit 340, the display unit 350, etc., in response to a control command generated by a user on the basis of operating the console 360 or an operation panel/button, etc., disposed on a housing of a main magnet.

In an embodiment, the controller 320, the image reconstruction unit 330, and the processing unit 340 may separately or collectively include a computer and a storage medium. The storage medium records a predetermined control program and data processing program to be executed by the computer. For example, the storage medium may store a program for implementing imaging scanning, image reconstruction, image processing, etc. For example, the storage medium may store a program for implementing the method for generating a magnetic resonance image according to embodiments of the present invention. The storage medium may include, for example, a ROM, a floppy disk, a hard disk, an optical disk, a magneto-optical disk, a CD-ROM, or a non-volatile memory card.

The foregoing magnetic resonance imaging device 300 is described only as one example. In other embodiments, the device may have various variations, as long as image data can be acquired from the imaging object.

Figure 4:
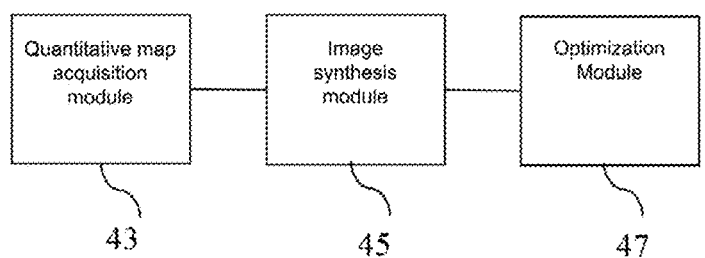
FIG. 4 is a block diagram of a system for generating a magnetic resonance image according to an embodiment of the present invention.

Referring to FIG. 4, an embodiment of the present invention may further provide a system for generating a magnetic resonance image. The system includes a quantitative map acquisition module 43, an image synthesis module 45, and an optimization module 47.

The quantitative map acquisition module 43 is configured to acquire a quantitative map. In an example, the quantitative map acquisition module 41 can communicate with a reconstruction module of a magnetic resonance imaging device to receive an initial image, which is generated by executing a preset scan sequence by the magnetic resonance imaging device (for example, the device as shown in FIG. 3). In other examples, the quantitative map acquisition module 41 may communicate with a data storage module to retrieve a quantitative map pre-stored therein.

The image synthesis module 45 is configured to synthesize a plurality of corresponding first weighted images on the basis of the plurality of quantitative maps.

The optimization module 47 is configured to convert any of the first weighted images into a corresponding second weighted image on the basis of a trained deep learning network.

The principle and examples of the method for generating a magnetic resonance image of the embodiments of the present invention have been described in detail, and the system for generating a magnetic resonance image of the embodiments of the present invention can be used to perform the foregoing method, and both have the same inventive concept.

Another embodiment of the present invention further provides a computer-readable storage medium, including a stored computer program, where the method for generating a magnetic resonance image according to an embodiment of the present invention is performed when the computer program is run.

Figure 5:
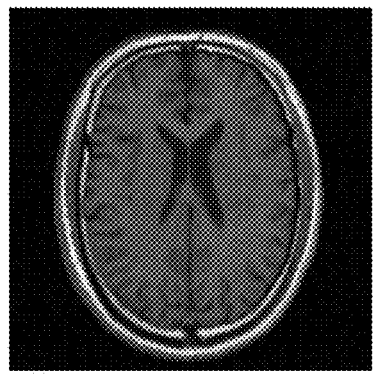
FIG. 5 and FIG. 6 respectively show a brain T1WI image generated according to an embodiment of the present invention and a brain T1WI image reconstructed by actual scanning.
Figure 6:
Figure 7:
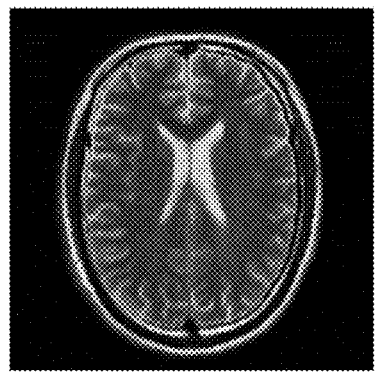
FIG. 7 and FIG. 8 respectively show a brain T2WI image generated according to an embodiment of the present invention and a brain T2WI image reconstructed by actual scanning.
Figure 8:
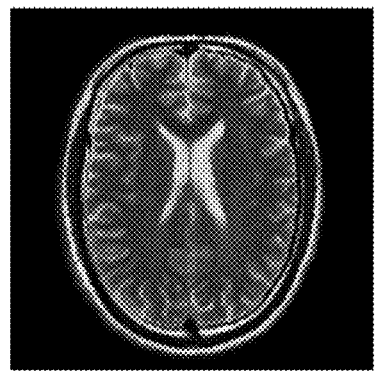
Figure 9:
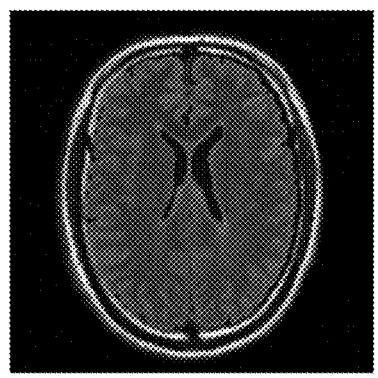
FIG. 9 and FIG. 10 respectively show a brain T2W-Flair image generated according to an embodiment of the present invention and a brain T2W-Flair image reconstructed by actual scanning.
Figure 10:
Figure 11:
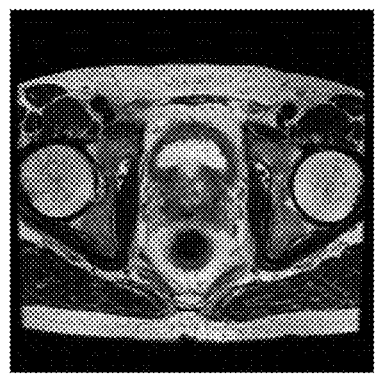
FIG. 11 and FIG. 12 respectively show a prostate T2WI image generated according to an embodiment of the present invention and a prostate T2WI image reconstructed by actual scanning.
Figure 12:
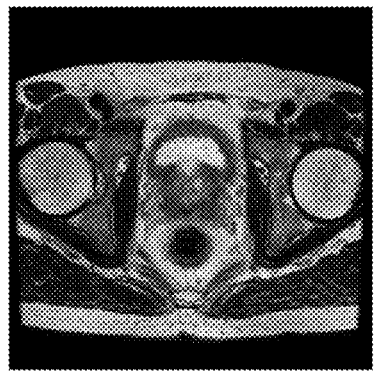

FIG. 5 and FIG. 6 respectively show a brain T1WI image generated according to an embodiment of the present invention and a brain T1WI image reconstructed by actual scanning FIG. 7 and FIG. 8 respectively show a brain T2WI image generated according to an embodiment of the present invention and a brain T2WI image reconstructed by actual scanning FIG. 9 and FIG. 10 respectively show a brain T2W-Flair image generated according to an embodiment of the present invention and a brain T2W-Flair image reconstructed by actual scanning FIG. 11 and FIG. 12 respectively show a prostate T2WI image generated according to an embodiment of the present invention and a prostate T2WI image reconstructed by actual scanning. By comparing the various weighted images generated on the basis of the embodiments of the present invention with the actual scanned images, it is found that the method of the present invention can obtain images that are very close to actual scanned imaging results. Therefore, the method can replace an existing scanning procedure to perform magnetic resonance imaging.

Various embodiments of the present invention first generate a first weighted image by using a quantitative map, and then using the first weighted image as an input to a deep learning network, where the deep learning network has been trained to be capable of optimizing the first weighted image, so as to obtain a second weighted image. Compared with the prior art, there is no need to perform a real scan to obtain the image, thereby greatly reducing the time of MRI examination. The second weighted image has very close image characteristics and image quality to an actual scanned and reconstructed image, enabling rapid imaging while ensuring the reliability of medical diagnosis. Moreover, because the first weighted image as an intermediate result is first acquired according to the quantitative map and then used as the input of the deep learning network, a simplified neural network structure can be obtained by effectively utilizing prior information, and it is easier to process details such as parameter adjustment and network structure optimization, which improves efficiency to some extent and can also avoid complicated image post-processing operations.

In various embodiments above, the processing unit and the control unit include a circuit that is configured to execute one or a plurality of tasks, functions or steps discussed herein. In various embodiments, the processing unit may be integrated with the data processing unit 120 of the magnetic resonance imaging system, and the control unit may be integrated with the control unit 130 of the magnetic resonance imaging system. The "processing unit" and "control unit" used herein are not intended to necessarily be limited to a single processor or computer. For example, the processing unit and the control unit may include a plurality of processors, ASICs, FPGAs and/or computers, and the plurality of processors, ASICs, FPGAs and/or computers may be integrated in a common housing or unit, or may be distributed among various units or housings. The depicted processing unit and control unit include a memory. The memory 130 may include one or more computer-readable storage media. For example, the memory 130 may store information about system characteristics (for example, information about spatial gradients), images (for example, standard human body images), algorithms or processes for performing any of the embodiments described above, and the like. Further, the process flow and/or flowchart (or aspects thereof) discussed herein may represent one or more instruction sets stored in the memory for guiding scanning control or pre-scanning control.

As used herein, an element or step described as singular and preceded by the word "a" or "an" should be understood as not excluding such element or step being plural, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional elements that do not have such property. The terms "including" and "in which" are used as the plain-language equivalents of the respective terms "comprising" and "wherein." Furthermore, in the appended claims, the terms "first", "second," "third" and so on are used merely as labels, and are not intended to impose numerical requirements or a particular positional order on their objects.

This written description uses examples to disclose the present invention, including the best mode, and also to enable those of ordinary skill in the relevant art to implement the present invention, including making and using any devices or systems and performing any incorporated methods. The patentable scope of the present invention is defined by the claims, and may include other examples that occur to those skilled in the art. Such other examples are intended to be within the scope of the claims if they have structural elements that do not differ from the literal language of the claims, or if they include equivalent structural elements without substantial differences from the literal language of the claims.

The invention claimed is:

1. A method for generating a magnetic resonance image, comprising:
    acquiring, via a processing system comprising one or more processors, an initial image utilizing a magnetic resonance scanner;
    calculating, via the processing system, a plurality of quantitative maps based on the initial image;
    synthesizing, via the processing system, a first weighted image based on of the plurality of quantitative maps;
    converting, via the processing system, the first weighted image into a corresponding second weighted image utilizing a trained deep learning network, wherein the second weighted image is of higher image quality than the first weighted image so that the second weighted image has an image quality that allows its utilization in clinical observation; and
    displaying, via the processing system, the second weighted image on a display.

2. The method according to claim 1, wherein the plurality of quantitative maps comprise a T1 quantitative map, a T2 quantitative map, and a proton density quantitative map.

3. The method according to claim 2, wherein the step of synthesizing a first weighted image comprises:
    determining the first weighted image according to a preset relationship between a quantitative value in the plurality of quantitative maps and a hypothetical sequence parameter and an image signal value.

4. The method according to claim 3, wherein the hypothetical sequence parameter comprises part or all of hypothetical echo time, hypothetical repetition time, and hypothetical inversion recovery time.

5. The method according to claim 4, wherein the first weighted image is a T1-weighted image, a T2-weighted image, or a proton density-weighted image, and the first weighted image is obtained on the basis of the following formula:

$$S=PD \cdot \exp(-TE/T2) \cdot (1-\exp(-TR/T2)),$$

where S is an image signal value of the first weighted image, exp is an exponential function with the natural constant e as a base, TE is the hypothetical echo time, TR is the hypothetical repetition time, and T1, T2, and PD are a TI quantitative value, a T2 quantitative value, and a proton density quantitative value, respectively.

6. The method according to claim 4, wherein the first weighted image is a T1WI-Flair image, a T2WI-Flair image, a STIR image, or a PSIR image, and the first weighted image is obtained on the basis of the following formula:

$$S=PD \cdot \exp(-TE/T2) \cdot (1-2 \cdot \exp(-TI/T1)+\exp-TR/T1),$$

where S is an image signal value of the first weighted image, exp is an exponential function with the natural constant e as a base, TE is the hypothetical echo time, TR is the hypothetical repetition time, TI is the hypothetical inversion recovery time, and T1, T2, and PD are a T1 quantitative value, a T2 quantitative value, and a proton density quantitative value, respectively.

7. The method according to claim 2, wherein the step of synthesizing a first weighted image further comprises: separately performing a convolution operation on the plurality of quantitative maps, and synthesizing the first weighted image on the basis of a result of the convolution operation.

8. The method according to claim 1, wherein an input data set for training the deep learning network comprises a plurality of the first weighted images, and an output data set for training the deep learning network comprises: a plurality of real weighted images obtained by performing a magnetic resonance imaging scan and performing image reconstruction on the basis of scan data.

9. The method according to claim 8, wherein a network parameter of the deep learning network is obtained by solving the following formula:

$$\min \theta \| f(\theta)-f \|2,$$

where $\theta$ is the network parameter, f comprises the real weighted image, $f(\theta)$ represents an output of the deep learning network, and min represents minimization.

10. A non-transitory, computer-readable storage medium, the non-transitory computer-readable storage medium comprising processor-executable code that when executed by a processing system comprising one or more processors, causes the processing system to:
    acquire an initial image utilizing a magnetic resonance scanner;
    calculate a plurality of quantitative maps based on the initial image;
    synthesize a first weighted image based on the plurality of quantitative maps;
    convert the first weighted image into a corresponding second weighted image utilizing a trained deep learning network, wherein the second weighted image is of higher image quality than the first weighted image so that the second weighted image has an image quality that allows its utilization in clinical observation; and
    display the second weighted image on a display.

11. A system for generating a magnetic resonance image, comprising:
    a memory encoding processor-executable routines; and
    a processing system comprising one or more processors and configured to access the memory and to execute the processor-executable routines, wherein the processor-executable routines, when executed by the processing system, cause the processing system to:
    acquire an initial image utilizing a magnetic resonance scanner;
    calculate a plurality of quantitative maps based on the initial image;
    synthesize a first weighted image based on the plurality of quantitative maps;
    convert the first weighted image into a corresponding second weighted image utilizing a trained deep learning network, wherein the second weighted image is of higher image quality than the first weighted image so that the second weighted image has an image quality that allows its utilization in clinical observation; and
    display the second weighted image on a display.

* * * * *